(12) United States Patent
Takada et al.

(10) Patent No.: US 9,426,391 B2
(45) Date of Patent: Aug. 23, 2016

(54) SOLID-STATE IMAGING APPARATUS, METHOD OF CONTROLLING THE SAME, AND IMAGING SYSTEM

(71) Applicant: CANON KABUSHIKI KAISHA, Tokyo (JP)

(72) Inventors: Yoshiaki Takada, Kawasaki (JP); Kazuki Ohshitanai, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/683,595

(22) Filed: Apr. 10, 2015

(65) Prior Publication Data

US 2015/0319381 A1    Nov. 5, 2015

(30) Foreign Application Priority Data

May 2, 2014   (JP) ................................ 2014-095283

(51) Int. Cl.
   *H04N 5/347*    (2011.01)
   *H04N 5/369*    (2011.01)
   *H04N 5/374*    (2011.01)
   *H01L 27/146*   (2006.01)
   *H04N 5/361*    (2011.01)
   *H04N 5/3745*   (2011.01)

(52) U.S. Cl.
   CPC .......... *H04N 5/347* (2013.01); *H01L 27/14623* (2013.01); *H04N 5/3696* (2013.01); *H04N 5/374* (2013.01); *H04N 5/361* (2013.01); *H04N 5/37457* (2013.01)

(58) Field of Classification Search
   None
   See application file for complete search history.

(56) References Cited

U.S. PATENT DOCUMENTS

| | | | | |
|---|---|---|---|---|
| 2008/0291290 | A1* | 11/2008 | Sonoda | H04N 5/361 348/222.1 |
| 2012/0194696 | A1 | 8/2012 | Ohshitanai et al. | |
| 2013/0021497 | A1* | 1/2013 | Kawamura | H04N 5/361 348/231.3 |
| 2014/0036121 | A1 | 2/2014 | Minowa et al. | |
| 2014/0320720 | A1 | 10/2014 | Ohshitanai | |
| 2014/0340554 | A1* | 11/2014 | Ishii | H04N 5/343 348/302 |
| 2015/0116538 | A1* | 4/2015 | Terauchi | H04N 5/355 348/229.1 |
| 2015/0163426 | A1 | 6/2015 | Ohshitanai | |

FOREIGN PATENT DOCUMENTS

JP         2011-097646 A    5/2011

OTHER PUBLICATIONS

U.S. Appl. No. 14/666,487, Yasuharu Ota, filed Mar. 24, 2015.

\* cited by examiner

*Primary Examiner* — Justin P Misleh
(74) *Attorney, Agent, or Firm* — Fitzpatrick, Cella, Harper & Scinto

(57) ABSTRACT

Provided is a solid-state imaging apparatus, including: a pixel array including: a first, a second, and a third non-effective pixel rows each including a non-effective pixel configured to output a signal that is independent of an amount of incident light; and a second pixel region having effective pixel rows each including an aperture pixel configured to output a signal that is dependent on an amount of incident light; and a mixing portion configured to: mix a signal output from the non-effective pixel in the first non-effective pixel row and a signal output from the non-effective pixel in the second non-effective pixel row; mix the signal output from the non-effective pixel in the first non-effective pixel row and a signal output from the non-effective pixel in the third non-effective pixel row; and mix signals together, which are output from the aperture pixels in the effective pixel rows.

9 Claims, 12 Drawing Sheets

FIG. 1

SOLID-STATE IMAGING APPARATUS, METHOD OF CONTROLLING THE SAME, AND IMAGING SYSTEM

BACKGROUND OF THE INVENTION

1. Field of the Invention

The present invention relates to a solid-state imaging apparatus, a method of controlling the same, and an imaging system.

2. Description of the Related Art

In Japanese Patent Application Laid-Open No. 2011-97646, there is disclosed a method of reading a pixel signal in a solid-state imaging apparatus, the method involving concurrently operating source follower circuits arranged in a plurality of rows in an image pickup region, and averaging (hereinafter referred to as "mixing") outputs of the plurality of source follower circuits on a column signal line. According to this method, the generation of a false signal may be suppressed even when the number of pixels to be read is reduced.

SUMMARY OF THE INVENTION

According to one aspect of the present invention, there is provided a solid-state imaging apparatus, including: a pixel array including a plurality of pixels arranged in matrix; and a mixing portion for mixing signals output from the plurality of pixels, the pixel array further including: a first pixel region having a first non-effective pixel row, a second non-effective pixel row, and a third non-effective pixel row each including a non-effective pixel configured to output a signal that is independent of an amount of incident light; and a second pixel region having a plurality of effective pixel rows each including an aperture pixel configured to output a signal that is dependent on an amount of incident light, the mixing portion being configured to: mix a signal output from the non-effective pixel in the first non-effective pixel row and a signal output from the non-effective pixel in the second non-effective pixel row; mix the signal output from the non-effective pixel in the first non-effective pixel row and a signal output from the non-effective pixel in the third non-effective pixel row; and mix signals together, which are output from the aperture pixels in the plurality of effective pixel rows included in the second pixel region.

Further features of the present invention will become apparent from the following description of exemplary embodiments with reference to the attached drawings.

DESCRIPTION OF THE EMBODIMENTS

Japanese Patent Application Laid-Open No. 2011-97646 has no description on the mixing of pixel signals output from non-effective pixel rows other than the image pickup region. Employing such a configuration that the pixel signals are mixed in non-effective pixel rows such as in a vertical optical black pixel (OB pixel) portion and a Null pixel portion in the same manner as in the image pickup region requires the number of non-effective pixel rows to be increased in order to mix the pixel signals. For this reason, the occupied area of a non-effective pixel region increases to increase the area of a chip.

In view of the above-mentioned circumstances, the following first to fourth embodiments of the present invention provide a solid-state imaging apparatus having a pixel configuration of mixing output signals of non-effective pixels, which is capable of reducing the number of non-effective pixel rows to reduce the area of a chip.

Preferred embodiments of the present invention will now be described in detail in accordance with the accompanying drawings.

First Embodiment

Figure 1:
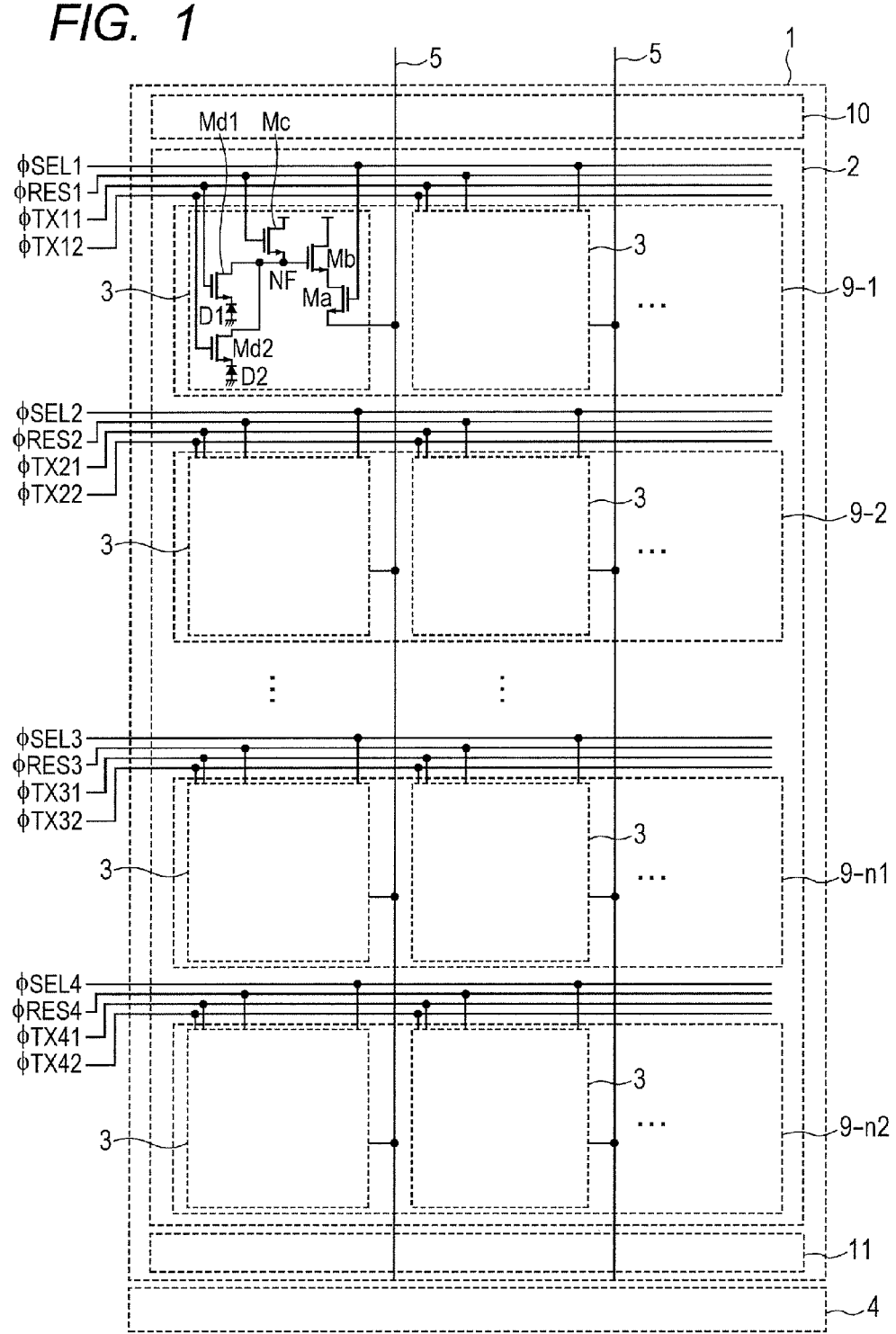
FIG. 1 is a diagram illustrating a configuration of a solid-state imaging apparatus according to a first embodiment of the present invention.

FIG. 1 is a diagram illustrating a configuration of a solid-state imaging apparatus according to the first embodiment of the present invention. The solid-state imaging apparatus includes a pixel array 1 in which a plurality of pixels are arranged in matrix, and a peripheral circuit portion 4 for reading signals from the pixel array 1. The pixel array 1 includes an aperture pixel portion 11, a Null pixel portion 10, and a vertical optical black pixel (OB pixel) portion 2.

The aperture pixel portion 11 includes a plurality of aperture pixels, and each aperture pixel includes a photodiode as a photoelectric conversion element for converting incident light into charges. Depending on the amount of light entering from the outside, an output signal of the aperture pixel changes. The Null pixel portion 10 includes a Null pixel including no photodiode, and a signal to be output from the Null pixel is used for correction of output fluctuations among columns. Because the Null pixel includes no photodiode, the output signal of the Null pixel is independent of the amount of light entering from the outside. The vertical OB pixel portion 2 includes an OB pixel including a photodiode covered with a light shielding film, such as aluminum. A signal to be output from the OB pixel is used for correction of noise caused by a dark current. Because the OB pixel is covered with the light shielding film, light entering from the outside does not reach the photodiode. Accordingly, the output signal of the OB pixel is also independent of the amount of light entering from the outside.

As described above, each row of the aperture pixel portion 11 is an effective pixel row that is primarily used to obtain an image signal, and each row of the vertical OB pixel portion 2 and the Null pixel portion 10 is a non-effective pixel row that is primarily used for noise correction. Because no image signal is output from the non-effective pixel row, it is preferred that the vertical OB pixel portion 2 and the Null pixel portion 10 be arranged on the outer periphery of the pixel array.

The vertical OB pixel portion 2 includes a plurality of pixel rows 9-1, 9-2 . . . 9-n1, and 9-n2. Each of the pixel rows 9-1, 9-2 . . . 9-n1, and 9-n2 includes a plurality of unit pixels 3. Each unit pixel 3 includes two photodiodes D1 and D2. FIG. 1 exemplifies the unit pixels arranged in four rows and two columns, but a larger number of the unit pixels 3 may be arranged in practice.

The unit pixel 3 includes the photodiodes D1 and D2, transfer transistors Md1 and Md2, a reset transistor Mc, an amplifier transistor Mb, and a select transistor Ma. Each transistor is formed of an N-type or P-type metal-oxide-semiconductor field-effect transistor (MOSFET). The following description assumes that each transistor is an N-type MOSFET. Control signals are input to gate terminals of the transfer transistors Md1 and Md2, the reset transistor Mc, and the select transistor Ma through connection lines shared for each row. For example, in the first pixel row 9-1, control signals $\phi$TX11, $\phi$TX12, $\phi$RES1, and $\phi$SEL1 are input to the gate terminals of the transistors Md1, Md2, Mc, and Ma, respectively.

The photodiodes D1 and D2 are connected to source terminals of the transfer transistors Md1 and Md2, respectively. Drain terminals of the transfer transistors Md1 and Md2 are connected to an input node NF of the amplifier transistor Mb. A floating diffusion (FD) region is formed at the input node NF so that charges may be transferred from the photodiodes. The input node NF is further connected to a source terminal of the reset transistor Mc and a gate terminal of the amplifier transistor Mb. A power supply voltage is supplied to a drain terminal of the reset transistor Mc and a drain terminal of the amplifier transistor Mb. A source terminal of the amplifier transistor Mb is connected to a drain terminal of the select transistor Ma. A source terminal of the select transistor Ma is connected to the peripheral circuit portion 4 through a column signal line 5. Because the unit pixel 3 includes the two photodiodes D1 and D2 arranged in the column direction, each of the pixel rows 9-1, 9-2 . . . 9-n1, and 9-n2 includes two photodiode rows. In the following, the row of the photodiodes D1 is referred to as "row D1", and the row of the photodiodes D2 is referred to as "row D2". The column direction means the direction along the column.

When the reset transistor Mc is turned on, the power supply voltage is supplied to the input node NF to reset a voltage of the input node NF. In this case, if the select transistor Ma is turned on, a voltage corresponding to the reset state of the input node NF is output to the column signal line 5. The voltage corresponding to the reset state is referred to as "reset voltage". After that, when the reset transistor Mc is turned off and, for example, the transfer transistor Md1 is turned on, the charges accumulated in the photodiode D1 are transferred to the input node NF, and a voltage corresponding to the transferred charges is output to the column signal line 5. The voltage that is based on the charges transferred to the input node NF is referred to as "luminance voltage". In this manner, the unit pixel 3 may output two kinds of voltage signals, the reset voltage and the luminance voltage. Obtaining a difference between the luminance voltage and the reset voltage by a downstream circuit, noise contained in signal from output from each pixel, such as reset noise, may be removed.

Figure 2:
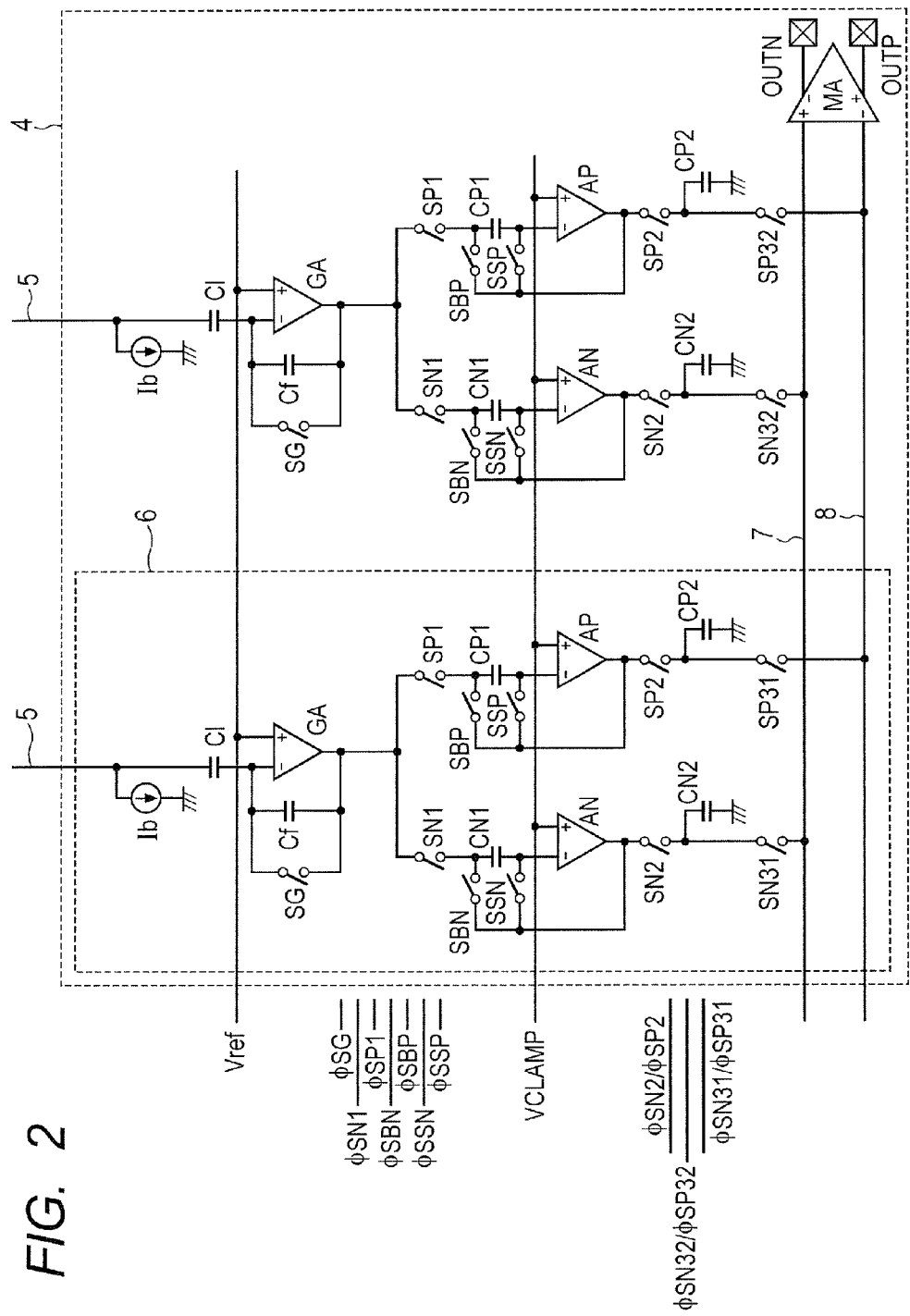
FIG. 2 is a diagram illustrating a circuit configuration of a peripheral circuit portion according to the first embodiment.

FIG. 2 is a diagram illustrating a circuit configuration of the peripheral circuit portion 4 according to the first embodiment. The peripheral circuit portion 4 includes a plurality of column readout circuits 6, and a differential chip external output circuit MA having differential input and output terminals. The column readout circuit 6 is arranged for each column of the pixel array 1. Outputs of the column readout circuit 6 in each column are connected to a reset voltage horizontal signal line 7 and a luminance voltage horizontal signal line 8, respectively. The reset voltage and the luminance voltage are input to the column readout circuit 6 in each column from the column signal line 5 in each column. The column readout circuit 6 reads the reset voltage and the luminance voltage, and outputs the reset voltage to the reset voltage horizontal signal line 7 and the luminance voltage to the luminance voltage horizontal signal line 8. The reset voltage and the luminance voltage are input to the differential chip external output circuit MA to be output from differential output terminals OUTN and OUTP to the outside of the peripheral circuit portion 4 as differential voltage signals.

The column readout circuit 6 includes a column current source Ib, a gain amplifier GA, a switch SG, an input capacitor Ci, and a feedback capacitor Cf as circuit elements for reading and amplifying the reset voltage and the luminance voltage. The column readout circuit 6 further includes, at a downstream stage, a reset voltage capacitor CN1, a second reset voltage capacitor CN2, a reset voltage amplifier AN, and switches SN1, SBN, SSN, SN2, and SN31 as circuit elements for amplifying and holding the reset voltage. The column readout circuit 6 further includes a luminance voltage capacitor CP1, a second luminance voltage capacitor CP2, a luminance voltage amplifier AP, and switches SP1, SBP, SSP, SP2, and SP31 as circuit elements for amplifying and holding the luminance voltage.

The column signal line 5 is connected to one terminal of the input capacitor Ci. The column current source Ib is connected to the column signal line 5, and functions as a current load for charging the input capacitor Ci with the reset voltage and the luminance voltage that are output from the unit pixel 3. The gain amplifier GA is an operational amplifier having an inverting input terminal, a non-inverting input terminal, and an output terminal. The other terminal of the input capacitor Ci is connected to the inverting input terminal of the gain amplifier GA. A reference voltage Vref is input to the non-inverting input terminal of the gain amplifier GA. The feedback capacitor Cf is connected between the inverting input terminal and the output terminal of the gain amplifier GA. The switch SG is further connected between the inverting input terminal and the output terminal of the gain amplifier GA, and hence the switch SG and the feedback capacitor Cf are connected in parallel. The switch SG is on/off controlled based on a control signal $\phi$SG.

On the downstream of the gain amplifier GA, the circuit for amplifying and holding the reset voltage and the circuit for amplifying and holding the luminance voltage are connected in parallel. Because both the circuits have the same circuit configuration, only the configuration of the circuit for amplifying and holding the reset voltage is now described.

The output terminal of the gain amplifier GA is connected to one terminal of the switch SN1, and the other terminal of the switch SN1 is connected to one terminal of the switch SBN and one terminal of the reset voltage capacitor CN1. The reset voltage amplifier AN is also an operational amplifier.

The other terminal of the reset voltage capacitor CN1 is connected to an inverting input terminal of the reset voltage amplifier AN and one terminal of the switch SSN. A clamp voltage VCLAMP is input to a non-inverting input terminal of the reset voltage amplifier AN. The other terminal of each of the switches SBN and SSN is connected to an output terminal of the reset voltage amplifier AN and one terminal of the switch SN2. The other terminal of the switch SN2 is connected to one terminal of the second reset voltage capacitor CN2 and one terminal of the switch SN31. The other terminal of the second reset voltage capacitor CN2 is grounded. The other terminal of the switch SN31 serves as a first output terminal of the column readout circuit 6, and is connected to a non-inverting input terminal of the differential chip external output circuit MA through the reset voltage horizontal signal line 7. The switches SN1, SBN, SSN, SN2, and SN31 are on/off controlled based on control signals $\phi$SN1, $\phi$SBN, $\phi$SSN, $\phi$SN2, and $\phi$SN31, respectively.

The circuit for amplifying and holding the luminance voltage has the same circuit configuration. A second output terminal of the column readout circuit 6, which is the output of this circuit, is connected to an inverting input terminal of the differential chip external output circuit MA through the luminance voltage horizontal signal line 8.

Figure 3:
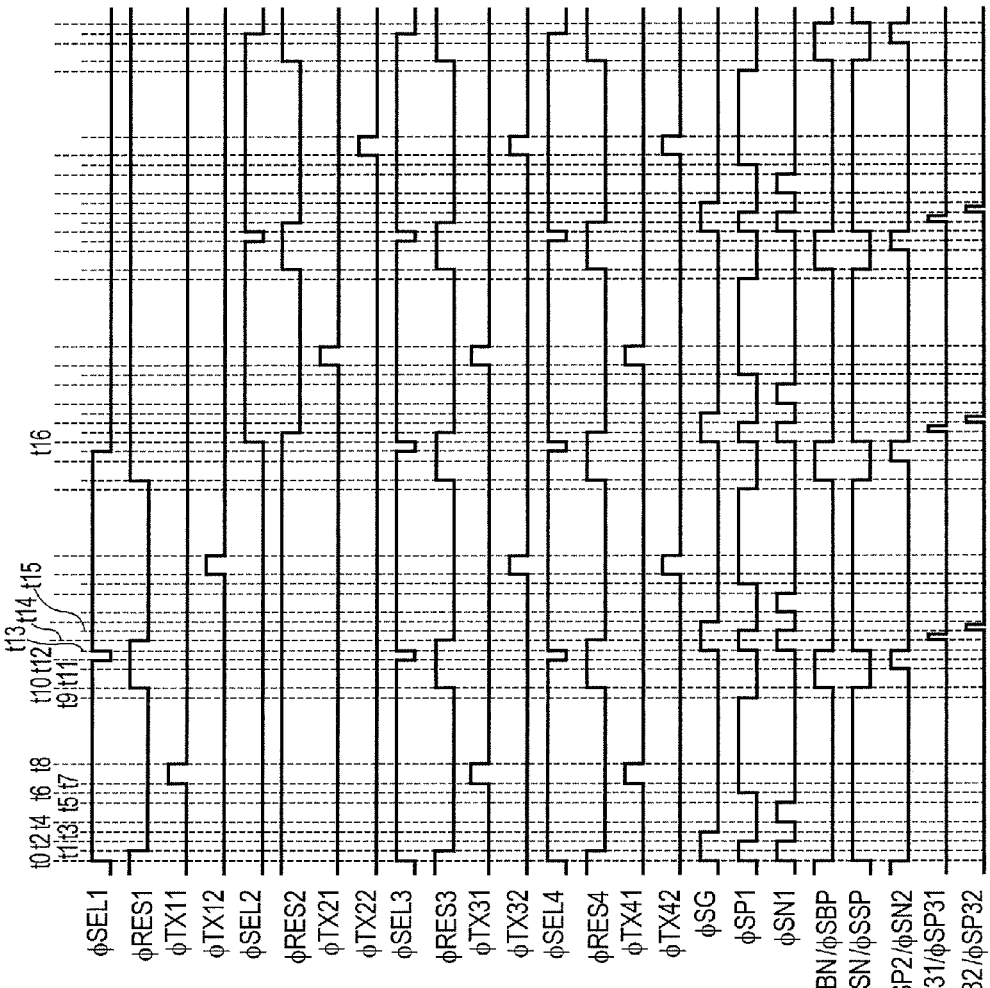
FIG. 3 is a timing chart illustrating a method of driving a vertical optical black pixel (OB pixel) portion and the peripheral circuit portion according to the first embodiment.

FIG. 3 is a timing chart illustrating a method of driving the vertical OB pixel portion 2 and the peripheral circuit portion 4 according to the first embodiment. This timing chart illustrates a drive method for reading the reset voltage and the luminance voltage from the vertical OB pixel portion 2. Because the photodiodes D1 and D2 of the vertical OB pixel portion 2 are covered with the light shielding film, the luminance voltage to be output therefrom is a voltage that is generated when no light enters, that is, a voltage generated by a dark current (hereinafter referred to as "dark voltage"). The following description assumes that the switches and the transistors are each configured to be turned on when the voltage of the control signal therefor is at High level and turned off when the voltage of the control signal therefor is at Low level.

The period from a time t0 to a time t13 is a period for reading the reset voltage and the dark voltage from the rows D1 in the pixel rows 9-1, 9-n1, and 9-n2 of the vertical OB pixel portion 2.

At the time t0, the control signals $\phi$SEL1, $\phi$SEL3, and $\phi$SEL4 become High level so that the select transistors Ma are turned on. Accordingly, the pixel rows 9-1, 9-n1, and 9-n2 of the vertical OB pixel portion 2 are selected. At the same time, the control signal $\phi$SG also becomes High level so that the switch SG is turned on. The non-inverting input terminal of the gain amplifier GA is connected to the output terminal thereof so that the gain amplifier GA functions as a voltage follower circuit. Accordingly, the voltage of the output terminal of the gain amplifier GA becomes the reference voltage Vref. Further, the control signals $\phi$SBN and $\phi$SBP become Low level so that the switches SBN and SBP are turned off. In addition, the control signals $\phi$SSN and $\phi$SSP become High level so that the switches SSN and SSP are turned on. Through those operations, the reset voltage amplifier AN and the luminance voltage amplifier AP enter a sampling mode, that is, the state in which a signal may be written into the reset voltage capacitor CN1 and the luminance voltage capacitor CP1. Then, at the same time, the control signals $\phi$SN1 and $\phi$SP1 become High level so that the switches SN1 and SP1 are turned on, and hence the reference voltage Vref output from the gain amplifier GA is written into the reset voltage capacitor CN1 and the luminance voltage capacitor CP1.

At the time t1, the control signals $\phi$RES1, $\phi$RES3, and $\phi$RES4 become Low level so that the reset transistors Mc in the pixel rows 9-1, 9-n1, and 9-n2 are turned off. Accordingly, the input node NF becomes floated.

At the time t2, the control signals $\phi$SN1 and $\phi$SP1 become Low level so that the switches SN1 and SP1 are turned off. Accordingly, the writing of the reference voltage Vref into the reset voltage capacitor CN1 and the luminance voltage capacitor CP1 is completed.

At the time t3, the control signal $\phi$SG becomes Low level so that the switch SG is turned off. Accordingly, the inverting input terminal of the gain amplifier GA is connected to the output terminal thereof via the feedback capacitor Cf, to thereby form an amplifier circuit. In this case, the gain of the amplifier circuit formed by the gain amplifier GA is (Ci/Cf).

At the time t4, the control signal $\phi$SN1 becomes High level so that the switch SN1 is turned on. The writing of the reset voltage of the unit pixel 3 into the reset voltage capacitor CN1 is started. After that, at the time t5, the control signal $\phi$SN1 becomes Low level so that the switch SN1 is turned off. Accordingly, the writing of the reset voltage into the reset voltage capacitor CN1 is completed.

At the time t6, the control signal $\phi$SP1 becomes High level so that the switch SP1 is turned on. Accordingly, the writing of the voltage of the input node NF of the unit pixel 3 into the luminance voltage capacitor CP1 is started.

At the time t7, the control signals $\phi$TX11, $\phi$TX31, and $\phi$TX41 become High level so that the transfer transistors Mdl of the unit pixels 3 are turned on. In this case, charges accumulated in the photodiode D1 due to the dark current are transferred to the input node NF, and the voltage of the input node NF decreases depending on the amount of accumulated charges of the photodiode D1. At the time t7, the control signals $\phi$SEL1, $\phi$SEL3, and $\phi$SEL4 are at High level, and hence the pixel rows 9-1, 9-n1, and 9-n2 are currently selected. Thus, pixel signals are output from the three pixel rows to the column signal line 5 in parallel and are mixed on the column signal line 5, and then the resultant voltage is written into the luminance voltage capacitor CP1. In other words, the plurality of pixel rows are selected and the pixel signals in the plurality of pixel rows are mixed on the column signal line 5, and hence the column signal line 5 functions as a mixing portion of the solid-state imaging apparatus according to this embodiment. As used herein, "mixing" refers to an operation of adding or averaging a plurality of charges, voltages, currents, and the like to be output as signals. Further, "mixing" includes not only simple addition and simple averaging, but also weighted addition and weighted averaging in which signals are each weighted with a predetermined ratio before addition and averaging. In the present invention, the mixing portion serving as the element for performing "mixing" is not limited to the above-mentioned configuration, and any configuration is applicable as long as pixel signals may be mixed.

At the time t8, the control signals $\phi$TX11, $\phi$TX31, and $\phi$TX41 become Low level so that the transfer transistors Mdl of the unit pixels 3 are turned off. The transfer of charges accumulated in the photodiode D1 to the input node NF is completed.

At the time t9, the control signal $\phi$SP1 becomes Low level so that the switch SP1 is turned off. The writing of the dark voltage into the luminance voltage capacitor CP1 is completed.

At the time t10, the control signals $\phi$RES1, $\phi$RES3, and $\phi$RES4 become High level so that the reset transistors Mc are turned on. The power supply voltage is supplied to the input node NF via the reset transistor Mc, and the floated state of the input node NF is finished. At the same time, the control signals $\phi$SBN and $\phi$SBP become High level so that the switches SBN and SBP are turned on. Further, the control signals ϕSSN and ϕSSP become Low level so that the switches SSN and SSP are turned off. Accordingly, the reset voltage amplifier AN enters a mode of reading the signal of the reset voltage capacitor CN1, and the luminance voltage amplifier AP enters a mode of reading the signal of the luminance voltage capacitor CP1.

At the time t11, the control signals ϕSN2 and ϕSP2 become High level so that the switches SN2 and SP2 are turned on. The reset voltage, which has been written into the reset voltage capacitor CN1, starts to be written into the second reset voltage capacitor CN2 by the reset voltage amplifier AN. Similarly, the dark voltage, which has been written into the luminance voltage capacitor CP1, starts to be written into the second luminance voltage capacitor CP2 by the luminance voltage amplifier AP.

At the time t12, the control signals ϕSEL1, ϕSEL3, and ϕSEL4 become Low level so that the select transistors Ma of the unit pixels 3 included in the pixel rows 9-1, 9-n1, and 9-n2 are turned off. Accordingly, the reading of the pixel signals in the rows D1 in the pixel rows 9-1, 9-n1, and 9-n2 is completed.

At the time t13, the control signals ϕSN2 and ϕSP2 become Low level so that the writing of the reset voltage into the second reset voltage capacitor CN2 and the writing of the dark voltage into the second luminance voltage capacitor CP2 are finished. At the same time, the control signals ϕSBN and ϕSBP become Low level so that the switches SBN and SBP are turned off. Further, the control signals ϕSSN and ϕSSP become High level so that the switches SSN and SSP are turned on, and the reset voltage amplifier AN and the luminance voltage amplifier AP return to the sampling mode.

At a time t14, the control signals ϕSN31 and ϕSP31 become High level so that the switches SN31 and SP31 are turned on. Accordingly, the reset voltage and the dark voltage in the first column, which have been accumulated in the second reset voltage capacitor CN2 and the second luminance voltage capacitor CP2, are read to the reset voltage horizontal signal line 7 and the luminance voltage horizontal signal line 8, respectively. In this case, the accumulated reset voltage and the accumulated dark voltage are divided by the capacitance of the reset voltage horizontal signal line 7 and the capacitance of the luminance voltage horizontal signal line 8, respectively, and are then input to the differential chip external output circuit MA. For example, when the capacitance value of the second luminance voltage capacitor CP2 is represented by C1 and the capacitance values of the reset voltage horizontal signal line 7 and the luminance voltage horizontal signal line 8 are represented by C2, the voltage gain is C1/(C1+C2). The differential chip external output circuit MA performs correlated double sampling, which obtains a difference between the voltages of the luminance voltage horizontal signal line 8 and the reset voltage horizontal signal line 7, that is, (luminance voltage-reset voltage), and outputs the resultant to the outside of the chip. In this manner, reset noise is removed.

At a time t15, control signals ϕSN32 and ϕSP32 become High level so that the switches SN2 and SP2 of the column readout circuit 6 in the second column are turned on. The reset voltage and the dark voltage in the second column, which have been accumulated in the second reset voltage capacitor CN2 and the second luminance voltage capacitor CP2, are read to the reset voltage horizontal signal line 7 and the luminance voltage horizontal signal line 8, respectively. The timing chart of FIG. 3 illustrates the control signals up to the second column and omits the control signals for the third and subsequent columns, but signals in the third and subsequent columns are similarly read. After the completion of reading for all the columns, the reading of dark signals that are output from the pixel rows 9-1, 9-n1, and 9-n2 and mixed together is finished.

In the period from the time t13 to a time t16, the reset voltage and the dark voltage are read from the rows D2 in the pixel rows 9-1, 9-n1, and 9-n2. The timings of respective pulses are the same as those of pulses for the reading from the rows D1 in the pixel rows 9-1, 9-n1, and 9-n2 in the period from the time t0 to the time t13, and hence a description thereof is omitted.

In the period from the time t16 to a time t17, the reset voltage and the mixed dark voltage in the pixel rows 9-2, 9-n1, and 9-n2 are read. The timings of respective pulses are the same as those in the period from the time t0 to the time t16 by replacing the control signals ϕSEL1, ϕRES1, ϕTX11, and ϕTX12 with control signals ϕSEL2, ϕRES2, ϕTX21, and ϕTX22, respectively, and hence a description thereof is omitted.

In the period from the time t0 to the time t16, the pixel row 9-1 and the two pixel rows 9-n1 and 9-n2 of the vertical OB pixel portion 2 are simultaneously selected. In the period from the time t16 to the time t17, the pixel row 9-2, which is next to the pixel row 9-1, and the pixel rows 9-n1 and 9-n2 are simultaneously selected. At the time t17 and thereafter, the pixel row 9-3, which is next to the pixel row 9-2, and the pixel rows 9-n1 and 9-n2 are simultaneously selected. In this manner, in this embodiment, one of the three pixel rows to be simultaneously selected from the vertical OB pixel portion is sequentially shifted from the first row so that a different row is selected at each stage, but the pixel rows 9-n1 and 9-n2 are always selected as the remaining two rows.

Figure 4:
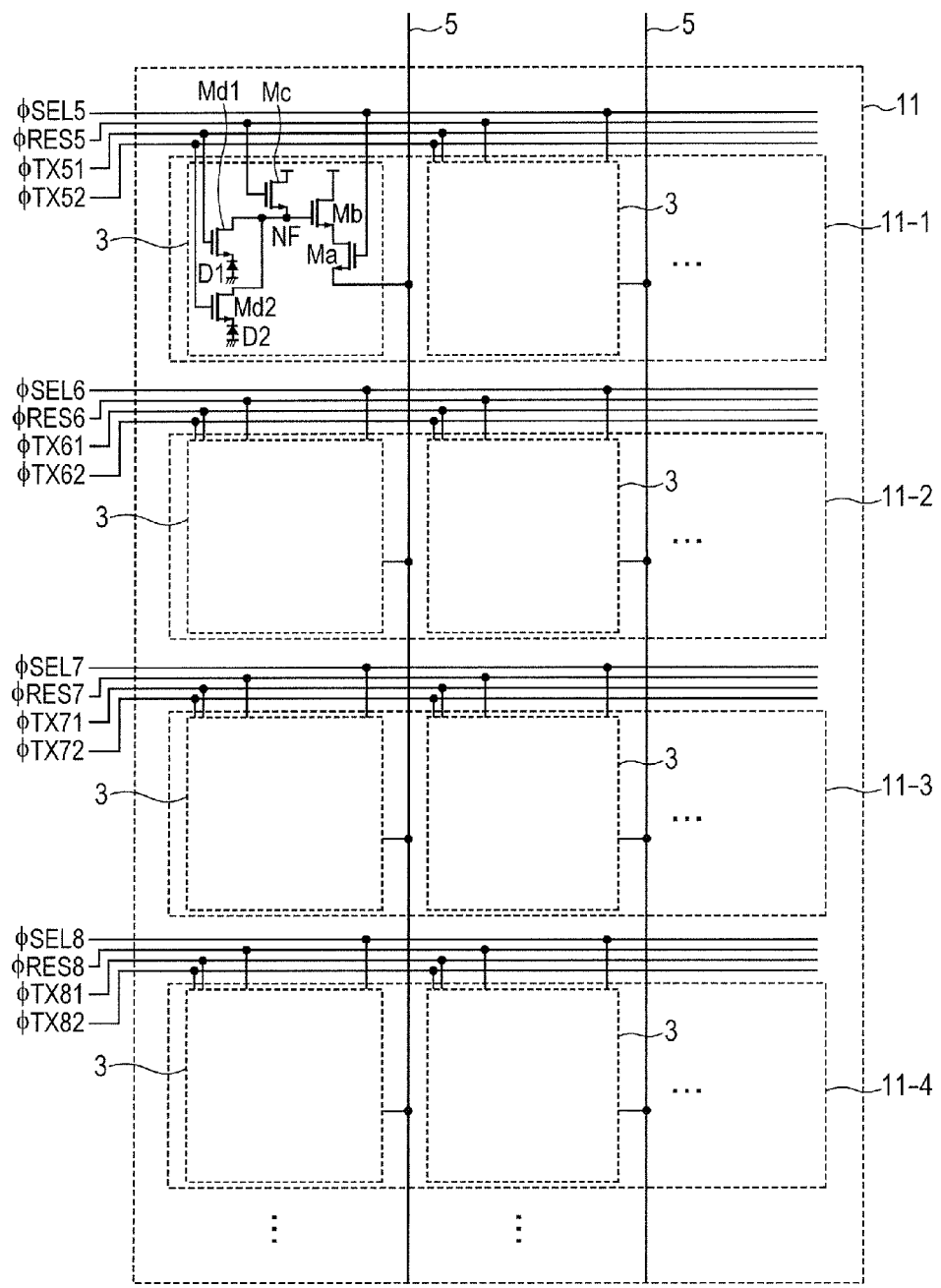
FIG. 4 is a diagram illustrating a circuit configuration of an aperture pixel portion according to the first embodiment.

FIG. 4 is a diagram illustrating a configuration of the aperture pixel portion 11 according to the first embodiment. FIG. 4 illustrates four pixel rows 11-1, 11-2, 11-3, and 11-4 included in the aperture pixel portion 11, but a larger number of pixels may be arranged. For example, the unit pixels 3 may be arranged in several thousand rows and several thousand columns. The unit pixel 3 included in the aperture pixel portion 11 differs from the above-mentioned unit pixel 3 of the vertical OB pixel portion 2 in that the unit pixel 3 of the aperture pixel portion 11 does not include a light shielding film on the photodiode D1 or D2 so that a luminance signal corresponding to the amount of incident light may be output. However, the circuit configuration of the unit pixel 3 of the aperture pixel portion 11 is the same as that of the unit pixel 3 of the vertical OB pixel portion 2, and hence a detailed description thereof is omitted. Symbols of control signals input to the gate terminals of the transistors Md1, Md2, Mc, and Ma in the pixel row 11-1 are ϕTX51, ϕTX52, ϕRES5, and ϕSEL5, respectively. Similarly, control signals ϕTX61 and the like are input in the pixel row 11-2, control signals ϕTX71 and the like are input in the pixel row 11-3, and control signals ϕTX81 and the like are input in the pixel row 11-4.

Figure 5:
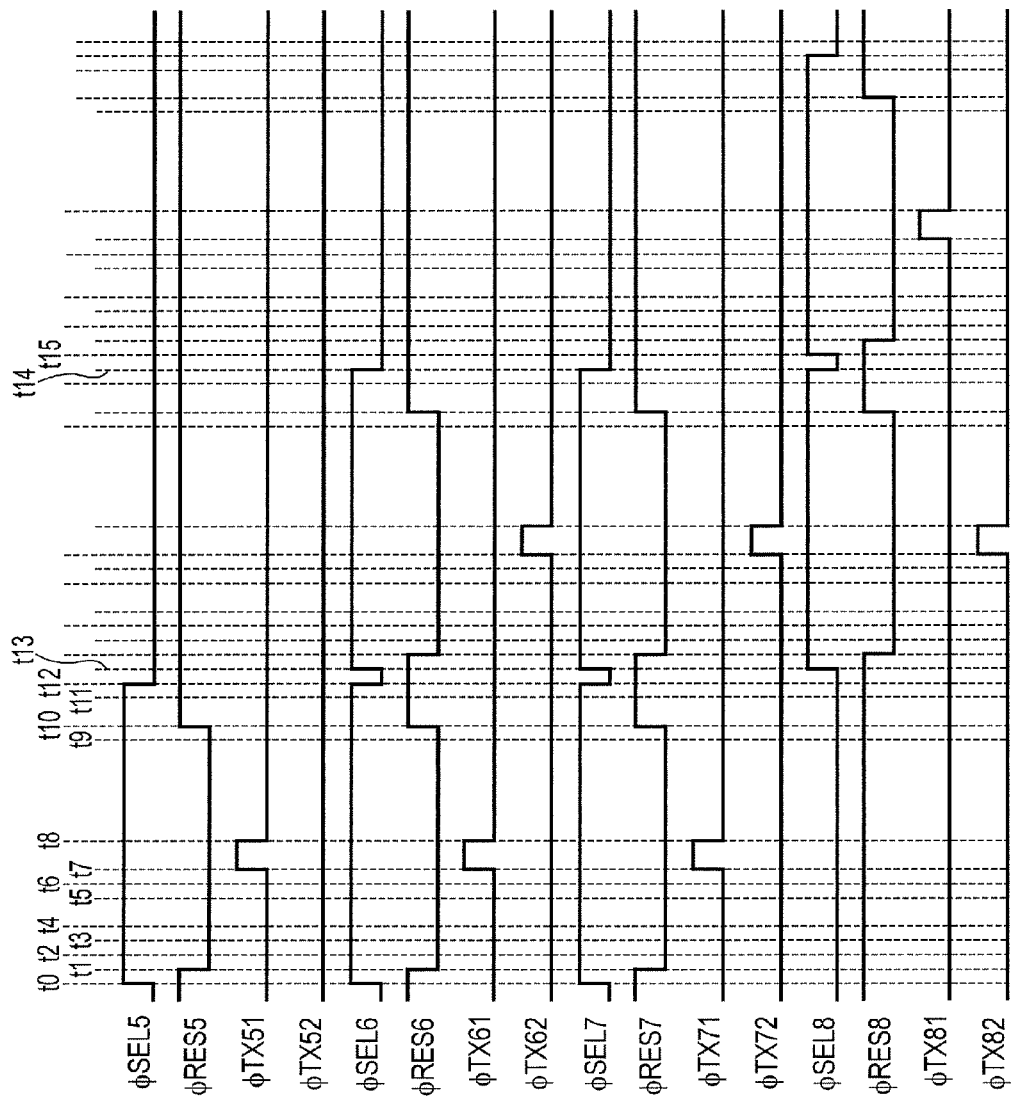
FIG. 5 is a timing chart illustrating a method of driving the aperture pixel portion according to the first embodiment.

FIG. 5 is a timing chart illustrating a method of driving the aperture pixel portion 11 and the peripheral circuit portion 4 according to the first embodiment. The operation of the peripheral circuit portion 4 for reading the signals of the aperture pixel portion 11 is the same as that for reading the signals of the vertical OB pixel portion 2 illustrated in FIG. 3, and hence the timing chart of FIG. 5 omits the pulses for driving the switches of the peripheral circuit portion 4.

At a time t0, the control signals ϕSEL5, ϕSEL6, and ϕSEL7 become High level so that the select transistors Ma are turned on, and the pixel rows 11-1, 11-2, and 11-3 of the aperture pixel portion 11 are simultaneously selected.

At a time t1, the control signals φRES5, φRES6, and φRES7 become Low level so that the reset transistors Mc are turned off. Accordingly, the input node NF becomes floated. After that, the reset voltage is held in the peripheral circuit portion 4 (this operation is the same as in FIG. 3, and hence is not illustrated in the timing chart of FIG. 5).

At a time t7, the control signals φTX51, φTX61, and φTX71 become High level so that the transfer transistors Md1 in the rows D1 are turned on. Charges accumulated in the photodiode D1 due to light irradiation are transferred to the input node NF, and the voltage of the input node NF decreases depending on the amount of accumulated charges of the photodiode D1.

At a time t8, the control signals φTX51, φTX61, and φTX71 become Low level so that the transfer transistors Md1 are turned off. Accordingly, the transfer of charges accumulated in the photodiode D1 to the input node NF is completed. After that, the luminance voltage is held in the peripheral circuit portion 4 (this operation is the same as in FIG. 3, and hence is not illustrated in the timing chart of FIG. 5).

At a time t10, the control signals φRES5, φRES6, and φRES7 become High level so that the reset transistors Mc are turned on. Accordingly, the input node NF has the reset potential, and the floated state of the input node NF is finished.

At a time t12, the control signals φSEL5, φSEL6, and φSEL7 become Low level so that the select transistors Ma are turned off. The select of the pixel rows 11-1, 11-2, and 11-3 is canceled to complete the reading of pixel signals to the peripheral circuit portion 4. In the reading of pixel signals in the period from the time t0 to the time t12 as described above, the pixel signals from the rows D1 in the three pixel rows 11-1, 11-2, and 11-3 are simultaneously read to the column signal line 5 and mixed together.

In the period from a time t13 to a time t14, the reset signals from the pixel rows 11-2, 11-3, and 11-4 and the pixel signals in the rows D2 are read. The timings of respective pulses are the same as those of pulses for the reading from the rows D1 in the pixel rows 11-1, 11-2, and 11-3 in the period from the time t0 to the time t12. In the period after a time t15, similarly to the period from the time t0 to the time t14, the reading of pixel signals by simultaneously selecting three pixel rows is performed sequentially.

Three rows in the aperture pixel portion 11 from which pixel signals are read and mixed are different for every read-out period. In other words, every pixel row is used for mixing only once. On the other hand, when signals are to be read from the vertical OB pixel portion 2, two of the three pixel rows are repeatedly selected to read the signals, and only the remaining one pixel row is changed to read and mix the signals. According to the method of reading the vertical OB pixel portion 2 in this embodiment, the number of rows of the vertical OB pixel portion 2 may be reduced as compared to the case where the same operation as that for the mixing in the aperture pixel portion 11 is performed. Besides, in this embodiment, it is unnecessary to add an additional element for the mixing on the chip. For those reasons, the area of the chip may be reduced.

Next, the reason why the signals output from the vertical OB pixel portion 2 are mixed together in this embodiment is described. In order to reduce the number of pixel rows of the vertical OB pixel portion 2 necessary for image correction such as removal of a dark current component, it is conceivable to mix pixel signals only at the time of scanning of the aperture pixel portion 11 and not to mix pixel signals at the time of scanning of the vertical OB pixel portion 2. In this case, however, the number of pixel rows to be simultaneously selected is smaller at the time of scanning of the vertical OB pixel portion 2 than at the time of scanning of the aperture pixel portion 11, and hence the effective channel width W of the amplifier transistor Mb is reduced. The mutual conductance $g_m$ of the source follower circuit formed by the amplifier transistor Mb is proportional to the square root of the channel width W. Thus, the mutual conductance $g_m$ is smaller at the time of scanning of the vertical OB pixel portion 2 than at the time of scanning of the aperture pixel portion 11, with the result that drive power of the source follower circuit (the amount of current that may be supplied from the source follower circuit to the column signal line 5) is reduced.

Figure 6:
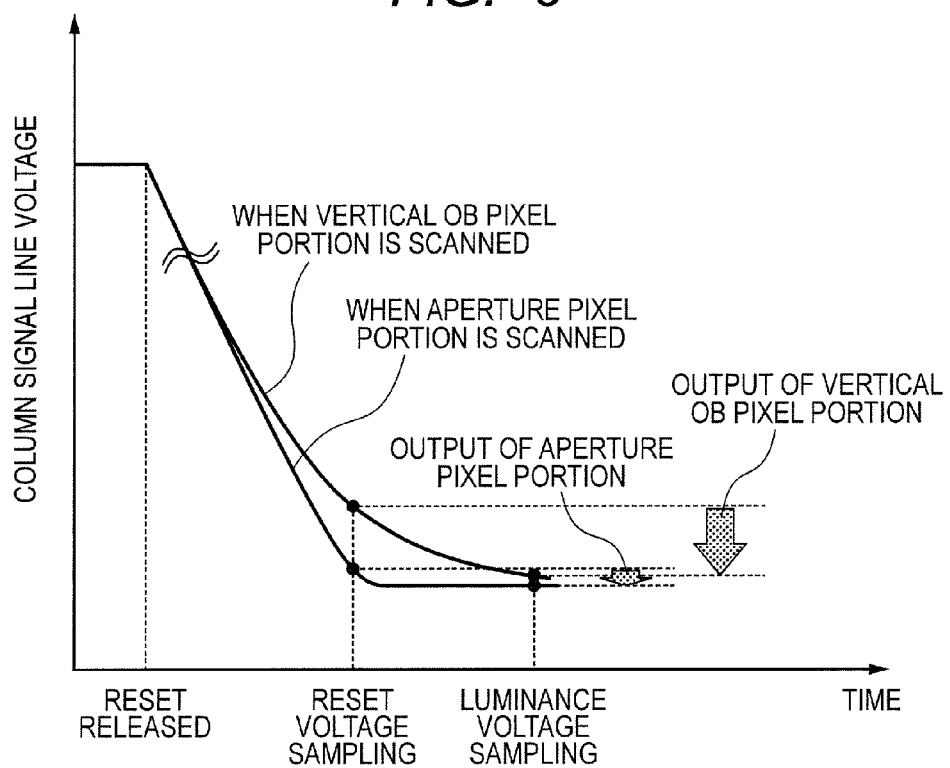
FIG. 6 is a graph showing a relationship between an output voltage of the vertical OB pixel portion and an output voltage of the aperture pixel portion in a case where signals of vertical OB pixels are not mixed.

FIG. 6 is a graph showing a relationship between an output voltage of the vertical OB pixel portion 2 and an output voltage of the aperture pixel portion 11 in a case where the signals of the vertical OB pixels are not mixed. The two curves in the graph of FIG. 6 represent the output voltage of the aperture pixel portion 11 subjected to mixing and the output voltage of the vertical OB pixel portion 2 not subjected to mixing. In FIG. 6, the timings of "reset released", "reset voltage sampling", and "luminance voltage sampling" correspond to t1, t5, and t9 in the timing chart of FIG. 3, respectively. As shown in FIG. 6, the settling time of the column signal line voltage at the time of reading of pixel signals becomes longer at the time of scanning of the vertical OB pixel portion 2 having lower drive power of the source follower circuit than at the time of scanning of the aperture pixel portion 11. On the other hand, the signal output is determined based on a difference between the column signal line voltage at the sampling of the luminance voltage and the column signal line voltage at the sampling of the reset voltage. Thus, the signal output becomes larger in the vertical OB pixel portion 2 than in the aperture pixel portion 11. The output of the vertical OB pixel portion 2 is used as a reference for image correction, and hence if there is a difference between the output of the vertical OB pixel portion 2 and the output of the aperture pixel portion 11, the accuracy of image correction is reduced. For this reason, in the first embodiment, the number of pixels whose signals are to be mixed is set equal for the scanning of the vertical OB pixel portion 2 and the scanning of the aperture pixel portion 11, to thereby set the same driving power to the source follower circuits. Consequently, the accuracy of image correction may be maintained to obtain an image from which the dark current component has been accurately removed.

The number of pixels whose signals are to be mixed in the vertical OB pixel portion 2 may be smaller than the number of pixels whose signals are to be mixed in the aperture pixel portion 11. For example, signals of three pixels are mixed at the time of scanning of the aperture pixel portion 11, and signals of two pixels are mixed at the time of scanning of the vertical OB pixel portion 2. In this manner, the number of rows of the vertical OB pixel portion 2 may be further reduced. Even when the numbers of pixels whose signals are to be mixed are not equal between the vertical OB pixel portion 2 and the aperture pixel portion 11, the above-mentioned influence of the output difference is suppressed as compared to the case where pixel signals are not mixed at the time of scanning of the vertical OB pixel portion 2.

As described above, in this embodiment, the signals output from the vertical OB pixel portion 2, which are used to remove a dark current component, are mixed. The number of those mixed signals is equal to the number of signals that are output from the aperture pixel portion 11 to be mixed, and hence substantially the same drive power may be set to the source follower circuits, to thereby remove the dark current component with high accuracy. Besides, in the reading method according to this embodiment, when signals are to be sequentially read from the vertical OB pixel portion 2, some of the rows used for mixing are repeatedly used, and hence the number of pixel rows in the vertical OB pixel portion 2 may be reduced. Consequently, the dark current component may be removed with higher accuracy, and the area of the chip may be reduced.

Second Embodiment

Figure 7:
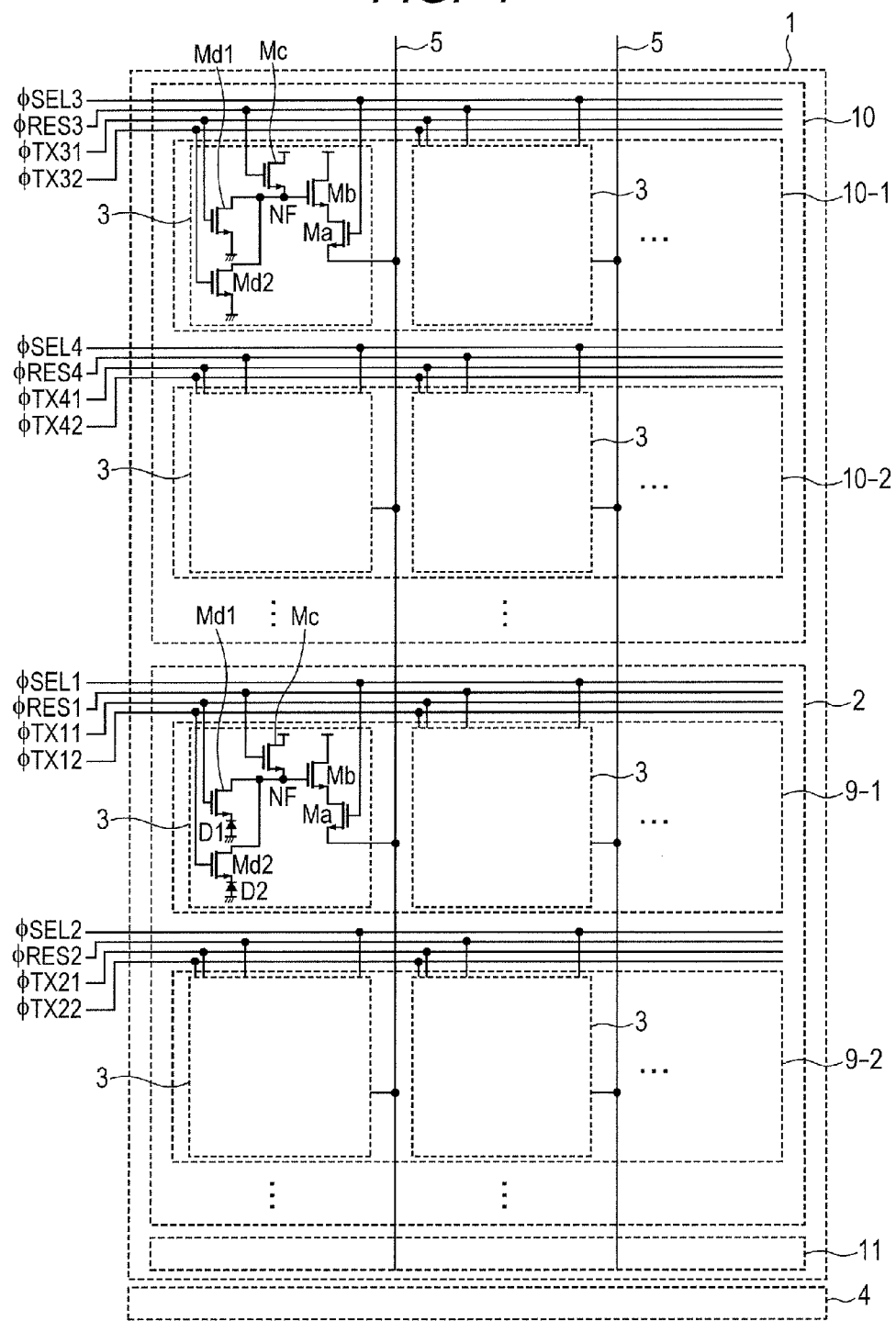
FIG. 7 is a diagram illustrating a configuration of a solid-state imaging apparatus according to a second embodiment of the present invention.

FIG. 7 is a diagram illustrating a configuration of a solid-state imaging apparatus according to the second embodiment of the present invention. Among three pixel rows to be simultaneously selected at the scanning of the vertical OB pixel portion 2, the two pixel rows 9-n1 and 9-n2, which are always selected in the first embodiment, are replaced with pixel rows 10-1 and 10-2 of the Null pixel portion 10 in the second embodiment. As described above, the Null pixel in the Null pixel portion 10 differs from the aperture pixel and the OB pixel in that the Null pixel includes no photodiode. The read timings of the vertical OB pixel portion 2 and the aperture pixel portion 11 are the same as those of FIG. 3 and FIG. 5, respectively. The circuits of the peripheral circuit portion 4 and the aperture pixel portion 11 are the same as those of FIG. 2 and FIG. 4, respectively. Also in this configuration, the difference between the output voltage of the vertical OB pixel, which is a reference for correction, and the output voltage of the aperture pixel portion 11 may be reduced similarly to the first embodiment. Consequently, according to the second embodiment, the accuracy of correction of output fluctuations performed by the vertical OB pixel may be improved. Besides, for the same reasons as in the first embodiment, the number of rows in the vertical OB pixel portion 2 may be reduced as compared to the case where the same mixing as that in the aperture pixel portion 11 is performed in the vertical OB pixel portion 2.

Third Embodiment

Figure 8:
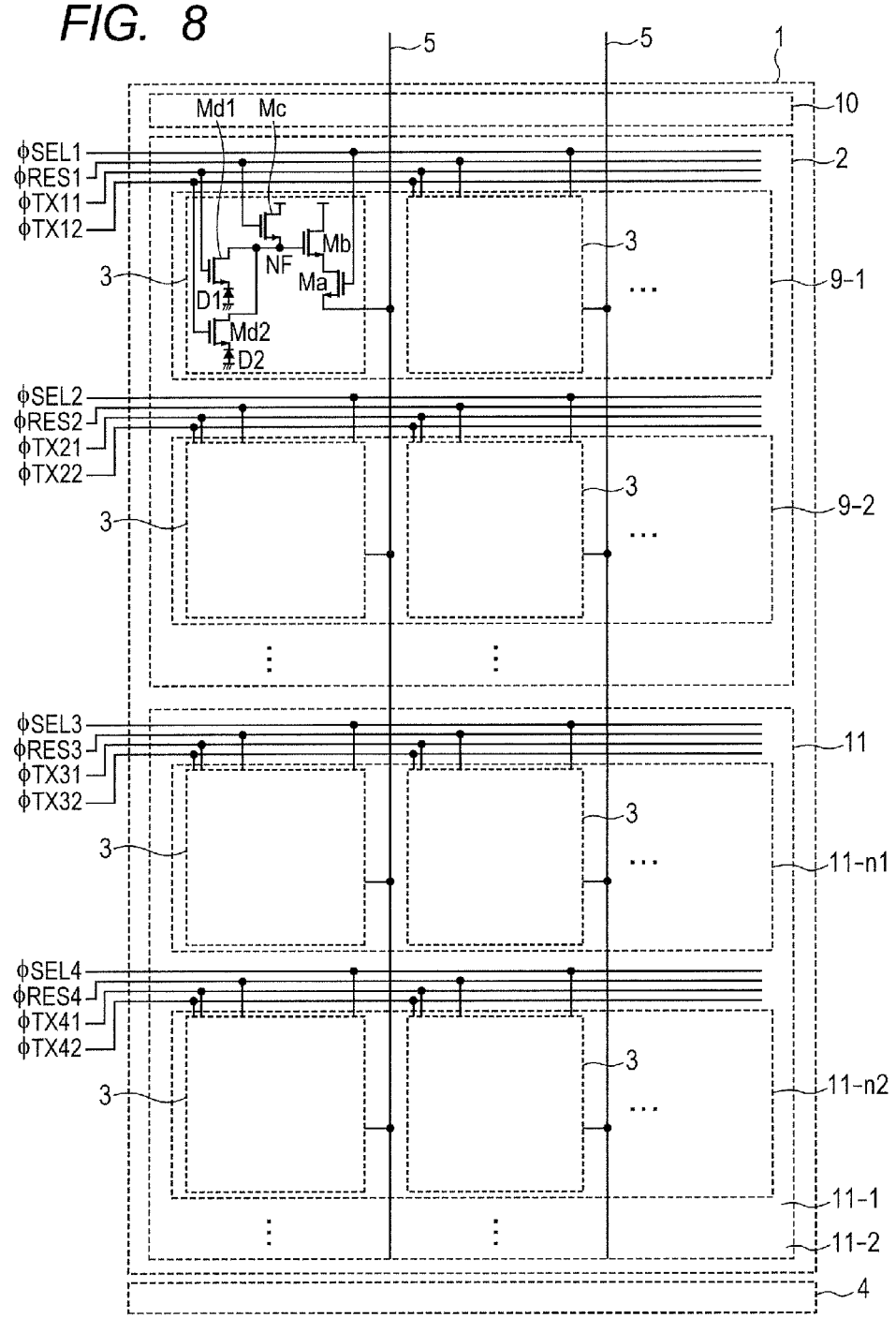
FIG. 8 is a diagram illustrating a configuration of a solid-state imaging apparatus according to a third embodiment of the present invention.

FIG. 8 is a diagram illustrating a configuration of a solid-state imaging apparatus according to the third embodiment of the present invention. Among three pixel rows to be simultaneously selected at the scanning of the vertical OB pixel portion 2, the two pixel rows 9-n1 and 9-n2, which are always selected in the first embodiment, are replaced with pixel rows 11-n1 and 11-n2 of the aperture pixel portion 11 in the third embodiment. The pixel rows 11-n1 and 11-n2 are pixel rows to be read as non-effective pixels, and are arranged in the vicinity of the vertical OB pixel portion 2.

Figure 9:
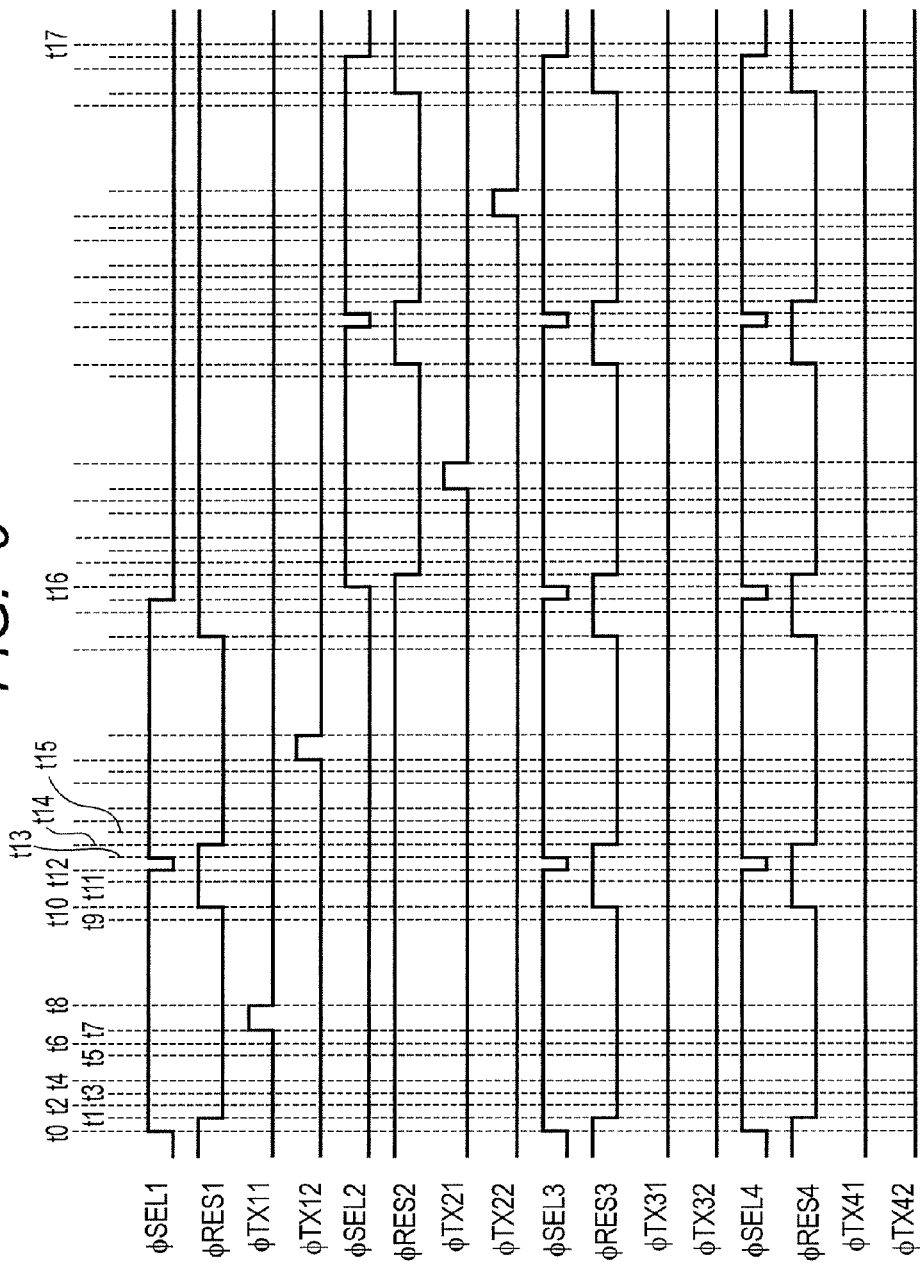
FIG. 9 is a timing chart illustrating a method of driving a vertical OB pixel portion according to the third embodiment.

FIG. 9 is a timing chart illustrating a method of driving the vertical OB pixel portion 2 according to the third embodiment. The difference from the first embodiment illustrated in FIG. 3 resides in that the control signals φTX31 and φTX41 are always at Low level and thus the transfer transistors Mdl of the unit pixels 3 included in the pixel rows 11-n1 and 11-n2 are always turned off. Specifically, in the drive method of FIG. 9, charges are not transferred from the photodiodes D1 and D2 in the pixel rows 11-n1 and 11-n2 to the input node NF. Accordingly, the pixel rows 11-n and 11-n2 included in the aperture pixel portion 11 that is not shielded from light and the pixel rows 9-1, 9-2, . . . included in the vertical OB pixel portion 2 that is shielded from light may be simultaneously selected to mix the pixel signals output from the aperture pixel portion 11 and the vertical OB pixel portion 2. The operation timing of the peripheral circuit portion 4 is the same as that of FIG. 3, and hence illustration thereof is omitted. Further, the circuit configuration of the pixel rows in the aperture pixel portion 11 except for the pixel rows 11-n1 and 11-n2 is the same as that in FIG. 4. The circuit configuration of the peripheral circuit portion 4 is the same as that in FIG. 2, and the operation timing of the peripheral circuit portion 4 is the same as that in FIG. 3. According to this embodiment, the number of rows in the vertical OB pixel portion 2 may be reduced for the same reasons as in the first embodiment.

As described above, the OB pixel differs in element structure from the aperture pixel in that the photoelectric conversion element is covered with the light shielding film. Accordingly, an aperture pixel that is adjacent to the OB pixel or an aperture pixel that is arranged away from the OB pixel by about several rows (hereinafter referred to as "in proximity to") may have different optical characteristics from those of an aperture pixel surrounded by aperture pixels. For this reason, the aperture pixel that is adjacent to or in proximity to the OB pixel may not be used for acquisition of an image signal. According to this embodiment, such aperture pixels may be utilized to reduce the number of rows in the vertical OB pixel portion 2. Consequently, the total number of pixel rows in the pixel portions may be efficiently reduced to reduce the area of the chip.

Fourth Embodiment

Figure 10:
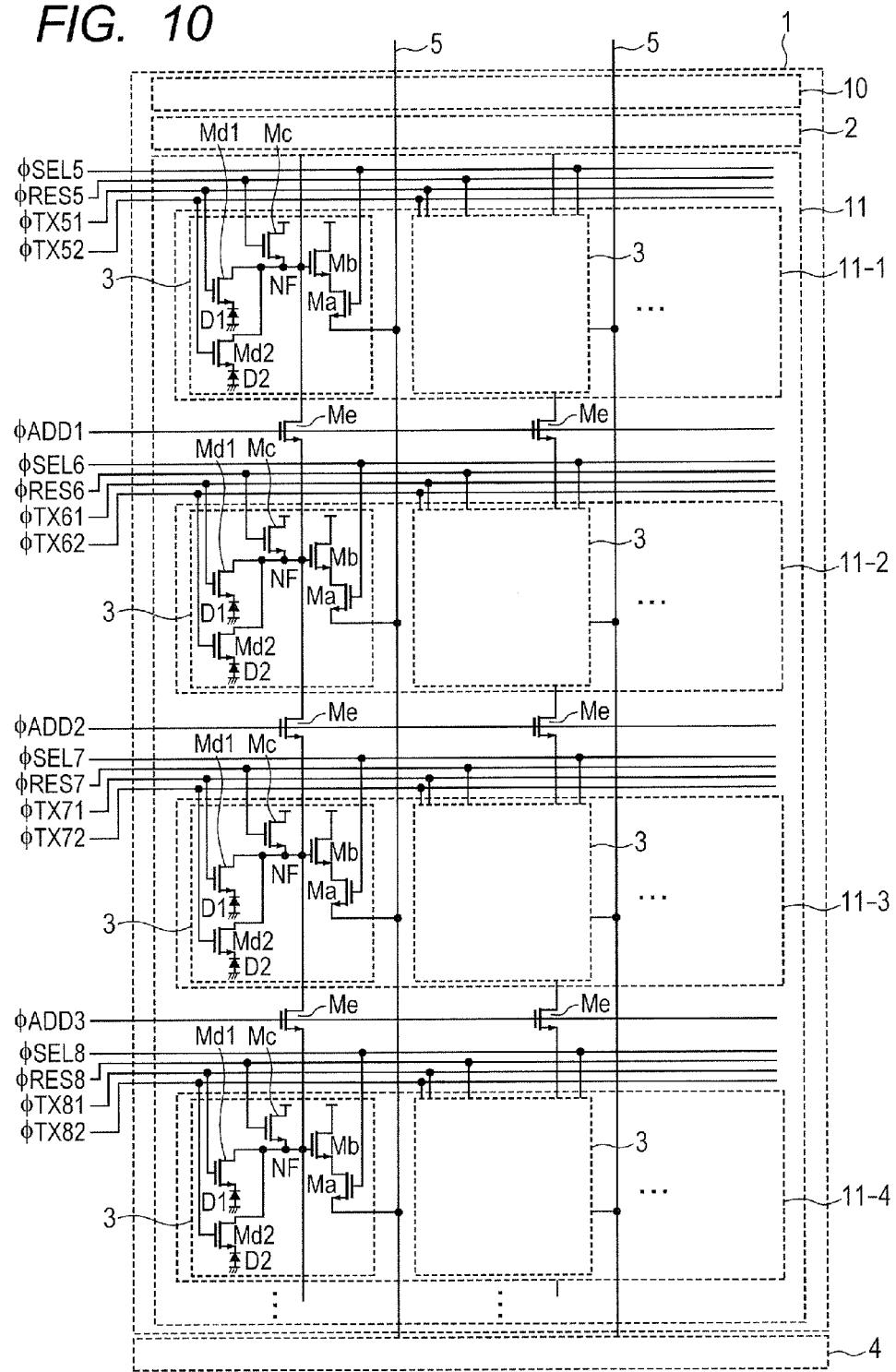
FIG. 10 is a diagram illustrating a configuration of a solid-state imaging apparatus according to a fourth embodiment of the present invention.

FIG. 10 is a diagram illustrating a configuration of a solid-state imaging apparatus according to the third embodiment of the present invention. The difference in circuit configuration from the first embodiment illustrated in FIGS. 1 and 4 resides in that an FD-connection transistor Me for connecting or disconnecting the floating diffusion (FD) regions is arranged between the input nodes NF in each pixel row. FIG. 10 omits the circuit configurations of the pixel portions other than the aperture pixel portion 11, but the FD-connection transistors Me are arranged also in the Null pixel portion 10 and the vertical OB pixel portion 2 in the same manner. The circuit configuration of the peripheral circuit portion is the same as that in FIG. 2. The FD-connection transistor Me that is connected between the aperture pixel portion 11-1 and the aperture pixel portion 11-2 is on/off controlled based a control signal φADD1. The FD-connection transistor Me that is connected between the aperture pixel portion 11-2 and the aperture pixel portion 11-3 is controlled based on a control signal φADD2. The same holds true for control signals φADD3 . . . .

The read timings of the vertical OB pixel portion 2 according to the fourth embodiment are the same as those of FIG. 3 illustrating the timings at the time of scanning of the vertical OB pixel portion 2 according to the first embodiment and the second embodiment and the same as those of FIG. 9 illustrating the timings at the time of scanning of the vertical OB pixel portion 2 according to the third embodiment. The FD-connection transistors Me are arranged also in the Null pixel portion 10 and the vertical OB pixel portion 2, but when the signals of the vertical OB pixel portion 2 are to be read, the FD-connection transistors Me of the Null pixel portion 10 and the vertical OB pixel portion 2 are turned off.

Figure 11:
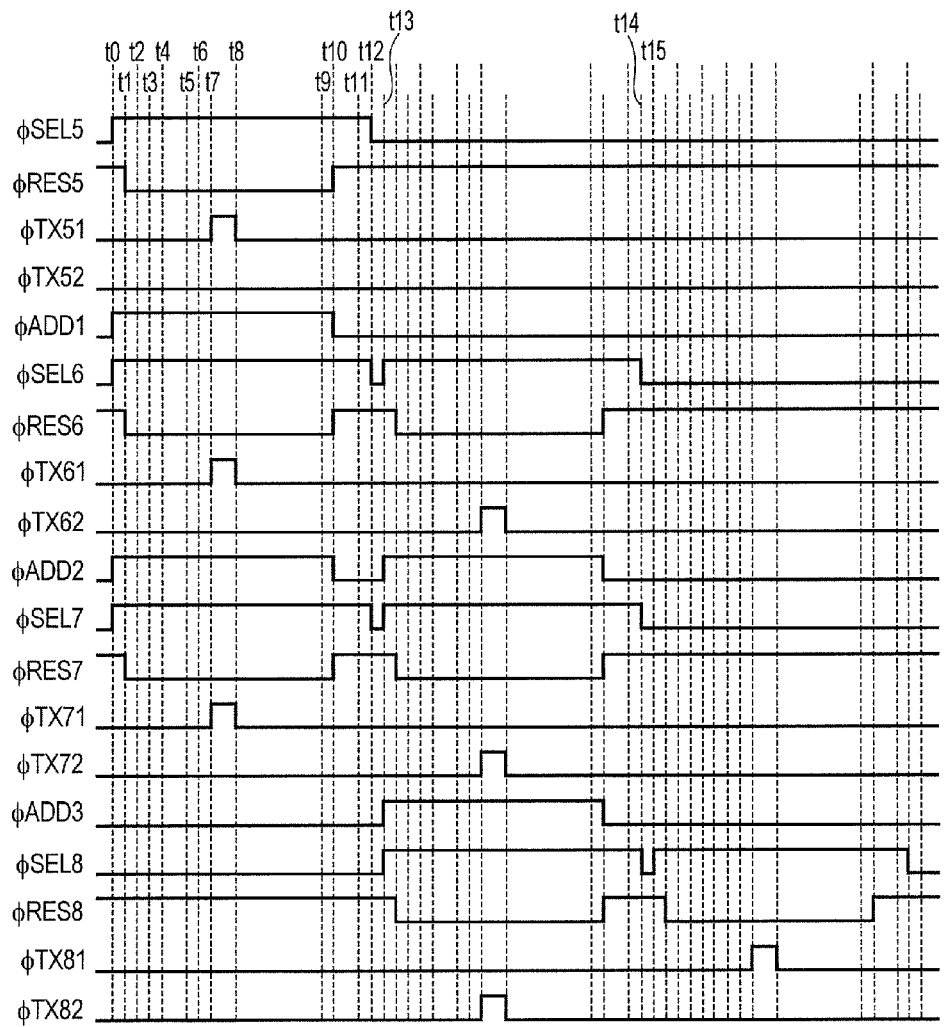
FIG. 11 is a timing chart illustrating a method of driving an aperture pixel portion according to the fourth embodiment.

FIG. 11 is a timing chart illustrating a method of driving the aperture pixel portion 11 according to the fourth embodiment. The difference from the timing chart in first embodiment illustrated in FIG. 3 resides in that the control signals φADD1, φADD2, and φADD3 for driving the FD-connection transistors Me are added. The other control signals are the same as those of FIG. 3.

At a time t0, the control signals φADD1 and φADD2 become High level so that the FD-connection transistors Me are turned on. Accordingly, the input nodes NF are connected to each other. After that, at a time t7, control signals φTX51, φTX61, and φTX71 become High level so that the transfer transistors Mdl are turned on. Accordingly, the charges generated by the photodiodes D1 in the pixel rows 11-1, 11-2, and 11-3 are mixed on the FD regions at the input nodes NF that are connected to each other via the FD-connection transistors Me. The charges generated by the photodiodes D2 are also mixed in the same manner. In other words, the plurality of input nodes NF are connected to each other and the pixel signals in the plurality of pixel rows are mixed on the FD regions at the input nodes NF, and hence the FD region functions as a mixing portion of the solid-state imaging apparatus according to this embodiment.

In the first to third embodiments, the signals from each column are amplified by the amplifier transistors Mb and output to the column signal line 5, followed by mixing the signals. In this case, if the gate voltages of the amplifier transistors are greatly different from one another, the signal obtained by the mixing on the vertical signal line becomes closer to any one of the signals of the amplifier transistors, with the result that signal accuracy may deteriorate. In this embodiment, on the other hand, the FD-connection transistor Me is arranged, and hence the charges generated by the photodiode D1 or D2 may be mixed on the FD regions before being amplified by the amplifier transistors Mb. In this mixing method, the signals from each column are mixed on the FD regions and then amplified by the amplifier transistors Mb to be output to the column signal line 5. Consequently, as compared to the first to third embodiments, the accuracy deterioration at the time of mixing is reduced in this embodiment, and hence even when there is a difference in intensity among signals from the unit pixels to be mixed, the signals may be mixed with higher accuracy.

Fifth Embodiment

Figure 12:
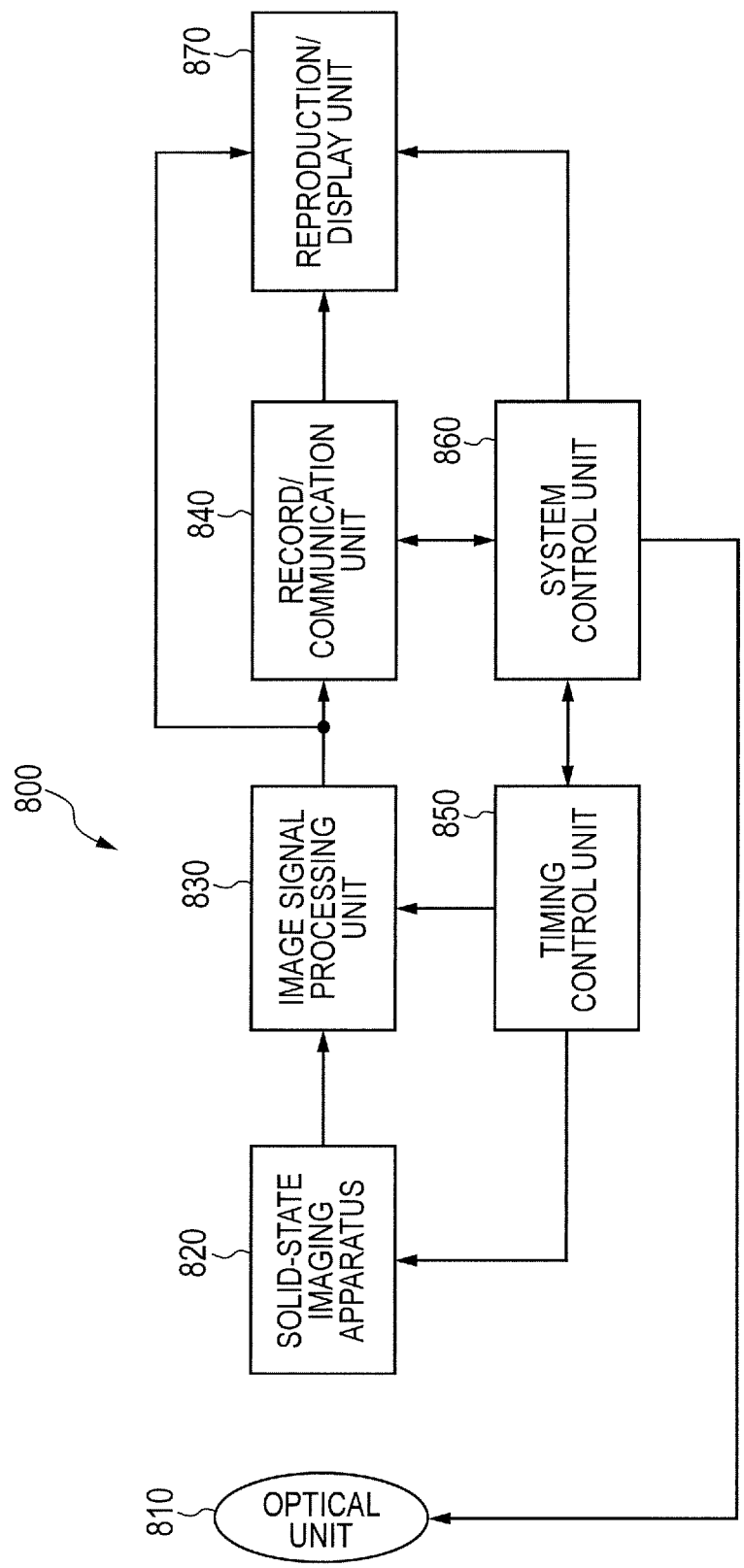
FIG. 12 is a block diagram illustrating a configuration of an imaging system according to a fifth embodiment of the present invention.

FIG. 12 is a diagram illustrating a configuration of an imaging system using a solid-state imaging apparatus according to a fifth embodiment of the present invention. An imaging system 800 includes an optical unit 810, a solid-state imaging apparatus 820, an image signal processing unit 830, a record/communication unit 840, a timing control unit 850, a system control unit 860, and a reproduction/display unit 870. As the solid-state imaging apparatus 820, the solid-state imaging apparatus described in the above-mentioned first to fourth embodiments is used.

The optical unit 810, which is an optical system such as a lens, forms an image of light from a subject on the pixel array 1 of the solid-state imaging apparatus 820 in which the plurality of unit pixels 3 are two-dimensionally arranged, to thereby form an image of the subject. The solid-state imaging apparatus 820 outputs a signal corresponding to the light whose image is formed on the pixel at the timing based on a signal transmitted from the timing control unit 850. The signal output from the solid-state imaging apparatus 820 is input to the image signal processing unit 830. The image signal processing unit 830 processes the input signal in accordance with a method determined by a program or the like. The signal obtained through the processing in the image signal processing unit 830 is transmitted to the record/communication unit 840 as image data. The record/communication unit 840 transmits a signal for forming an image to the reproduction/display unit 870, to thereby cause the reproduction/display unit 870 to reproduce or display a moving image or a still image. Further, in response to the signal from the image signal processing unit 830, the record/communication unit 840 communicates to/from the system control unit 860 and records the signal for forming an image in a recording medium (not shown).

The system control unit 860 controls the operation of the imaging system 800 in a comprehensive manner, and controls the drive of the optical unit 810, the timing control unit 850, the record/communication unit 840, and the reproduction/display unit 870. Further, the system control unit 860 includes a memory device (not shown), such as a recording medium. A program and the like necessary for controlling the operation of the imaging system 800 are recorded in the memory device. Further, the system control unit 860 supplies the imaging system 800 with a signal for switching a drive mode in accordance with a user's operation, for example. Specifically, the system control unit 860 supplies the imaging system 800 with a signal for performing switching, such as the change of a row to be read or a row to be reset, the change of the angle of view accompanying electronic zooming, and the shift of the angle of view accompanying electronic image stabilization. The timing control unit 850 controls drive timings of the solid-state imaging apparatus 820 and the image signal processing unit 830 based on the control by the system control unit 860.

In the solid-state imaging apparatus according to the first to fourth embodiments, the number of rows in a non-effective pixel region is reduced to downsize the solid-state imaging apparatus. Consequently, according to this embodiment, the imaging system 800 may be downsized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-095283, filed May 2, 2014, which is hereby incorporated by reference wherein in its entirety.

What is claimed is:
1. A solid-state imaging apparatus, comprising:
a pixel array comprising a plurality of pixels arranged in matrix; and
a mixing portion for mixing signals output from the plurality of pixels,
the pixel array further comprising:
a first pixel region having a first non-effective pixel row, a second non-effective pixel row, and a third non-effective pixel row each comprising a non-effective pixel configured to output a signal that is independent of an amount of incident light; and
a second pixel region having a plurality of effective pixel rows each comprising an aperture pixel configured to output a signal that is dependent on an amount of incident light,
the mixing portion being configured to:
mix a signal output from the non-effective pixel in the first non-effective pixel row and a signal output from the non-effective pixel in the second non-effective pixel row;
mix the signal output from the non-effective pixel in the first non-effective pixel row and a signal output from the non-effective pixel in the third non-effective pixel row; and
mix signals together, which are output from the aperture pixels in the plurality of effective pixel rows included in the second pixel region.
2. A solid-state imaging apparatus according to claim 1, wherein the second non-effective pixel row and the third non-effective pixel row each comprise at least one of an optical black pixel or a Null pixel as the non-effective pixel.

3. A solid-state imaging apparatus according to claim 1, wherein the first non-effective pixel row comprises at least one of an optical black pixel or a Null pixel as the non-effective pixel.

4. A solid-state imaging apparatus according to claim 1,
wherein the first non-effective pixel row comprises an aperture pixel,
wherein the first non-effective pixel row is arranged between the second non-effective pixel row and the third non-effective pixel row, and
wherein, in the mixing, a signal output from the aperture pixel in the first non-effective pixel row is independent of an amount of incident light.

5. A solid-state imaging apparatus according to claim 1,
wherein the mixing portion comprises a floating diffusion region that is formed in each of the plurality of pixels, and
wherein the pixel array further comprises a transistor connected between the floating diffusion regions, and when the transistor is turned on, the floating diffusion regions are connected to each other to mix the signals.

6. A solid-state imaging apparatus according to claim 1,
wherein the mixing portion comprises a column signal line, which is arranged in the pixel array, configured to connect in common the plurality of pixels arranged in a direction along the column, and
wherein, when signals are output form the plurality of pixels to the column signal line, the signals are mixed.

7. An imaging system, comprising the solid-state imaging apparatus of claim 1.

8. A method of controlling a solid-state imaging apparatus, the solid-state imaging apparatus including a pixel array comprising a plurality of pixels arranged in matrix, the pixel array further comprising:
a first pixel region having a first non-effective pixel row, a second non-effective pixel row, and a third non-effective pixel row each comprising a non-effective pixel configured to output a signal that is independent of an amount of incident light; and
a second pixel region having a plurality of effective pixel rows each comprising an aperture pixel configured to output a signal that is dependent on an amount of incident light,
the method comprising mixing signals output from the plurality of pixels, the mixing comprising:
mixing a signal output from the non-effective pixel in the first non-effective pixel row and a signal output from the non-effective pixel in the second non-effective pixel row;
mixing the signal output from the non-effective pixel in the first non-effective pixel row and a signal output from the non-effective pixel in the third non-effective pixel row; and
mixing signals together, which are output from the aperture pixels in the plurality of effective pixel rows included in the second pixel region.

9. A method of controlling a solid-state imaging apparatus according to claim 8,
wherein the pixel array further comprises a column signal line, which is connected in common to the plurality of pixels arranged in a direction along the column, and
wherein the mixing the signals is performed when the signals are output in parallel from the plurality of pixels to the column signal line.

\* \* \* \* \*